United States Patent
Mori et al.

[11] Patent Number: 6,025,555
[45] Date of Patent: *Feb. 15, 2000

[54] SOLAR CELL MODULE AND METHOD FOR MANUFACTURING THE SAME

[75] Inventors: Masahiro Mori, Seika-cho; Kimitoshi Fukae; Yuji Inoue, both of Nara, all of Japan

[73] Assignee: Canon Kabushiki Kaishia, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/701,753

[22] Filed: Aug. 22, 1996

[30] Foreign Application Priority Data

Aug. 23, 1995 [JP] Japan .................................. 7-215052

[51] Int. Cl.⁷ .................................................. H01L 31/048
[52] U.S. Cl. .............................. 136/251; 438/66; 257/433
[58] Field of Search ........................ 136/251, 259; 257/433; 438/64, 66; 72/182

[56] References Cited

U.S. PATENT DOCUMENTS

| 939,171 | 11/1909 | Sack | 72/182 |
|---|---|---|---|
| 1,691,032 | 11/1928 | Bittner | 72/182 |
| 2,660,909 | 12/1953 | Morse et al. | 72/182 |
| 4,433,200 | 2/1984 | Jester et al. | 136/251 |
| 5,092,939 | 3/1992 | Nath | 136/251 |
| 5,252,141 | 10/1993 | Inoue et al. | 136/251 |

FOREIGN PATENT DOCUMENTS

| 0 625 802 | 11/1994 | European Pat. Off. | H01L 31/042 |
|---|---|---|---|
| 9312518 | 11/1993 | Germany | H01L 31/048 |
| 96/39566 | 12/1996 | WIPO | E04D 13/18 |

*Primary Examiner*—Bernard Codd
*Attorney, Agent, or Firm*—Fitzpatrick, Cella, Harper & Scinto

[57] ABSTRACT

In a solar cell module in which a solar cell element is mounted on a four-sided metal plate, two opposite sides of the metal plate are bent, and a reinforcement member is provided on at least one of the two remaining sides. Thus, a solar cell module which is easily manufactured, lightweight, and inexpensive can be provided. Furthermore, the solar cell module of the present invention has excellent structural strength.

26 Claims, 8 Drawing Sheets

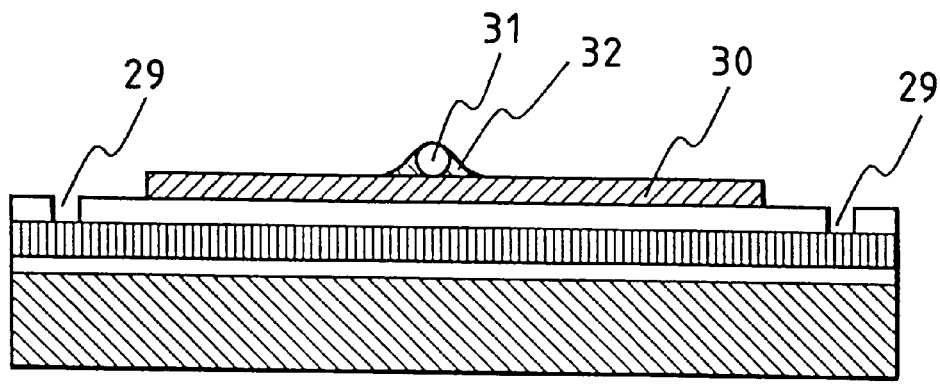
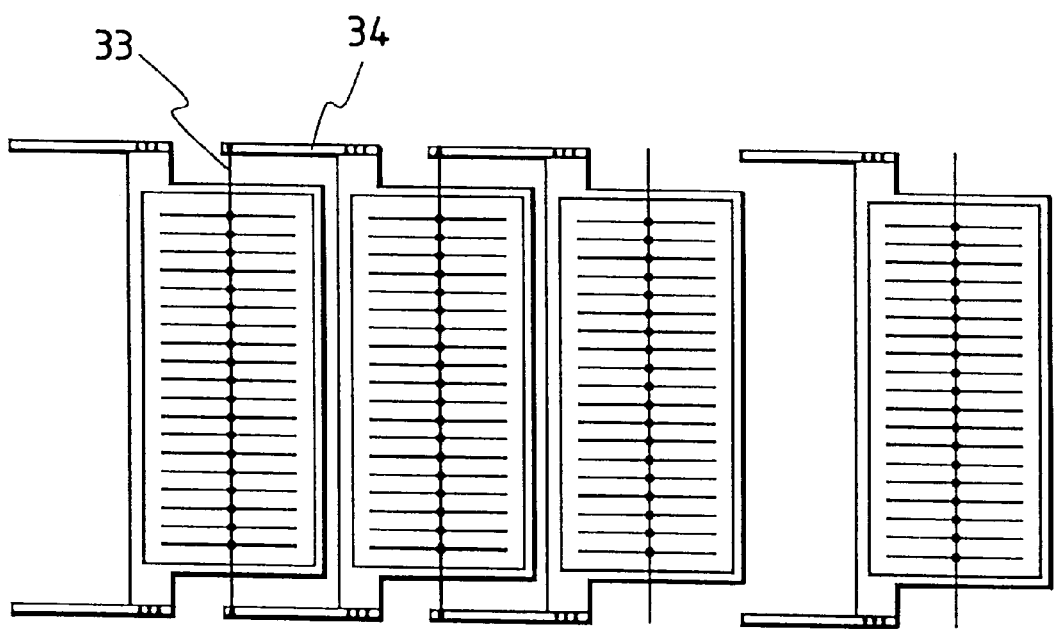

6,025,555

SOLAR CELL MODULE AND METHOD FOR MANUFACTURING THE SAME

BACKGROUND OF THE INVENTION

1. Field of the Invention

The present invention relates to a solar cell module which is easily fabricated, light in weight, low in price, and has excellent structural strength.

2. Related Background Art

In addition to research and development concerning solar cell elements per se, technological developments to make the solar cell elements available for use outdoors, for example, on the ground and on building roofs, have been conducted.

FIGS. 15 and 16 are sectional views schematically showing examples of two types of solar cell modules. Referring to FIGS. 15 and 16, a frame member 8 made of a material such as aluminum is provided at the periphery of solar cell modules 9 and 10, in order to reinforce the mechanical strength of the solar cell module and to mount it on a mounting stage.

The solar cell module illustrated in FIG. 15 employs a glass sheet 11 on its light receiving surface side and, on the back surface side, a film 12 having a moisture-resistant property such as a laminated film constituted of an aluminum film sandwiched between fluororesin films. In the solar cell modules, a solar cell element 13 or 17 is sealed by a translucent resin 14.

The solar cell module illustrated in FIG. 16 employs a fluororesin film 15 on its light receiving surface side and a metal reinforcement plate 16 on its back surface side. In this solar cell module, a solar cell element 17, for example, such as an amorphous silicon solar cell having a stainless substrate is sealed by a translucent resin 14. The solar cell module of this type does not require a glass member on the surface for preventing fracturing of the solar cell element 17 and protecting it, as the result of using a flexible cell element. Therefore, the solar cell module illustrated in FIG. 16 has an advantage in that it is possible to reduce the weight thereof compared to the module illustrated in FIG. 15 using the glass sheet 11.

As for the solar cell module of FIG. 16, a solar cell module of this type has been proposed in Japanese Patent Application Laid-open No. 5-337138, which does not use a frame member to secure its structural strength but is made as a box shape by bending its metal reinforcement plate 16 at four side portions so that it realizes sufficient structural strength as a module. Furthermore, this solar cell module does not comprise a frame member so that it is very useful in that it is light in weight and does not need a more complicated mounting step compared to the bending step.

When the solar cell module having such a solar cell element of a large area is fabricated, however, the following two problems are caused by the bending of its metal reinforcement member at the four side portions.

Problem 1

First, bending of the conventional solar cell module will be described below.

In the bending of the conventional solar cell module, a bending machine for a thin steel plate is used. FIG. 17 is a sectional view showing schematically the situation when a solar cell module 18 is being subjected to bending using this bending machine for a thin steel plate. During the bending, an upper knife edge 19 travels downward, whereby according to the mold 20, the solar cell module 18 is bent in the directions of the arrows.

Here, as is understood from the structure of the foregoing bending machine for a thin steel plate and the mechanism of the bending, the upper knife edge 19 of the bending machine and the mold 20 must have a larger length than that of the portion of the solar cell module which is to be bent (the length in a direction perpendicular to the drawing of FIG. 17). For this reason, when a solar cell module of a large area having a length of 3 m or more is bent, a large-sized bending machine for a thin steel plate is required which has an upper knife edge and mold having lengths more than 3 m and is capable of applying a very high pressure.

Problem 2

Also, when the shorter side of the metal reinforcement plate of the foregoing solar cell module is bent, the solar cell module is raised upward at 45 degrees to the horizontal during bending at a bending angle of 90 degrees. Therefore, a large space drawn by a circle of a radius of 3 m from this side of the bending machine is required in the upward direction. Moreover, since it is impossible for one worker to hold the raised solar cell module, at least two workers are necessary.

The present invention has been made in order to solve the foregoing problems 1 and 2.

SUMMARY OF THE INVENTION

In a solar cell module having a rectangular shape in which a solar cell element is arranged between a translucent resin film and a metal reinforcement plate, and the solar cell element is sealed by the translucent resin, the improvement wherein bending of the two longer sides of the rectangle is conducted, and a structural member for increasing the structural strength of the solar cell module is arranged on at least one of the two shorter sides of the rectangle.

An amorphous silicon solar cell element formed on a flexible stainless substrate is desirably used as the solar cell element.

The bending should be conducted using a roller mold machine which bends the two longer sides of the rectangle while transporting the solar cell module by a pair of rotating rollers.

BRIEF DESCRIPTION OF THE DRAWINGS

FIG. 7 is a sectional view showing a current collecting grid arranged in the solar cell module according to example 1 of the invention;

FIG. 8 is a plan view showing the solar cell elements connected in series in the solar cell module according to example 1 of the invention;

DETAILED DESCRIPTION OF THE PREFERRED EMBODIMENTS

Figure 17:
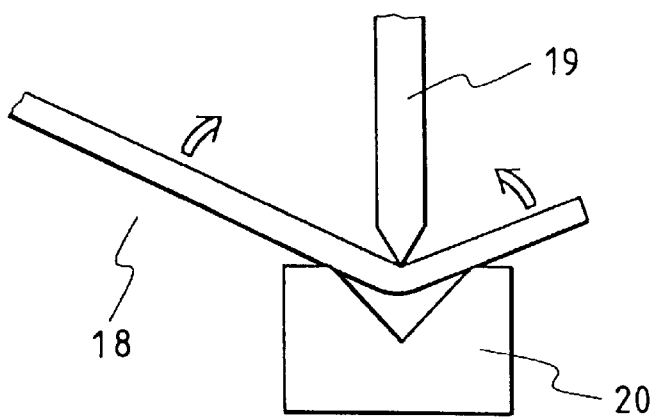
FIG. 17 is a cross-sectional view showing the situation that the conventional solar cell module is bent using a bending machine for a thin steel plate.

In a bending step for a solar cell module formed integrally with a metal reinforcement plate, the present invention does not use a conventional bending machine as shown in FIG. 17 but uses a roller mold machine. A roller mold machine is one which performs the bending while gradually transporting the bent body held between a pair of rotating rollers.

Figure 3:
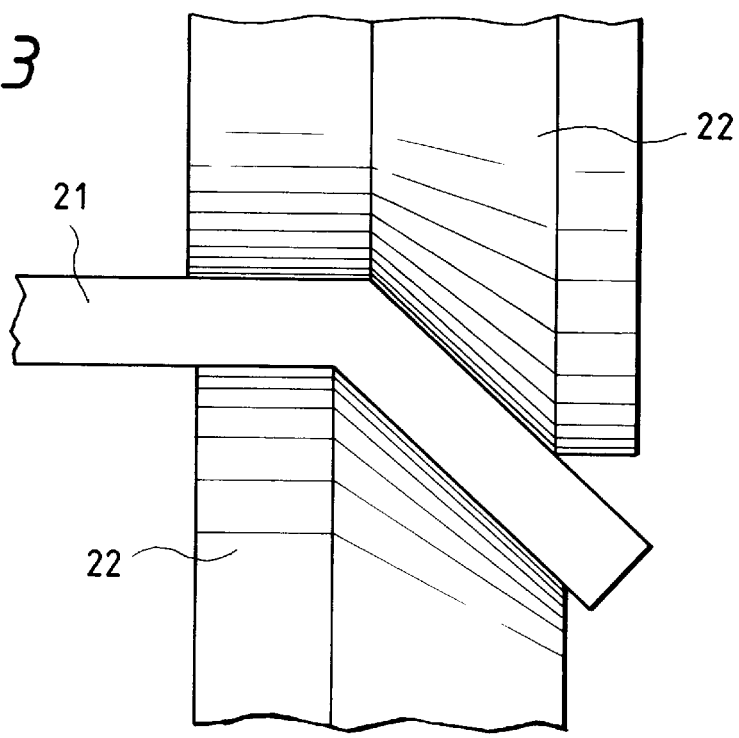
FIG. 3 is a sectional view showing the situation when the solar cell module is bent by a roller mold machine according to the invention.
Figure 4:
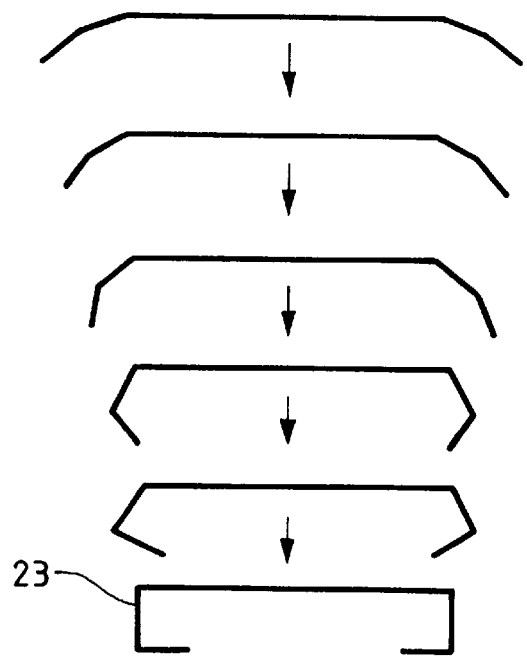
FIG. 4 is a sectional view showing the situation when the solar cell module according to the invention is bent gradually.

FIGS. 3 and 4 are schematical section views for explaining the bending by the roller mold machine. As is shown in FIG. 3, a solar cell module 21 is bent by making a pair of rollers 22 holding the module 21 in a desired shape.

As is seen from FIG. 4, a solar cell module 23 passes through a plurality of stations having a pair of rollers whereby the module 23 is bent step-by-step into a desired final shape.

As is understood from the structure of the foregoing roller mold machine and its operating mechanism, the size of the roller mold machine is determined primarily from the number of the stations in the pair of the rollers, and the number of the stations is determined primarily from the shapes of the bending portions, for example, their complexity and magnitude of the bending angle.

In the bending of the solar cell module 23 having a final cross section of a U-like shape, shown in FIG. 4, the number of bending stages is 6, and a roller mold machine having a length of about 1.8 m will perform well. Specifically, if the length of the module is 3 m or more and the module is bent to the aforementioned shape, the length of the roller mold machine may be 1.8 m, so that the size of the roller mold machine can be greatly reduced compared to the above-described conventional bending machine.

If the conventional bending machine is used, an operation of subjecting the solar cell module to a bending must be repeatedly performed at least four times. For this reason, it takes time and the labor cost for these operations increases the fabrication cost of the module. By contrast, according to the present invention, one worker can pass the module through the roller mold machine so that the bending of two facing sides is completed in one operation.

The direction of bending of the two facing sides may be opposite to the light receiving surface, or vice versa. Furthermore, each of the two facing sides may be bent in an opposite direction to each other. As shown in FIG. 4, by bending the module twice, its strength is increased. These bending steps can be done easily by the roller bending machine.

Figure 1:
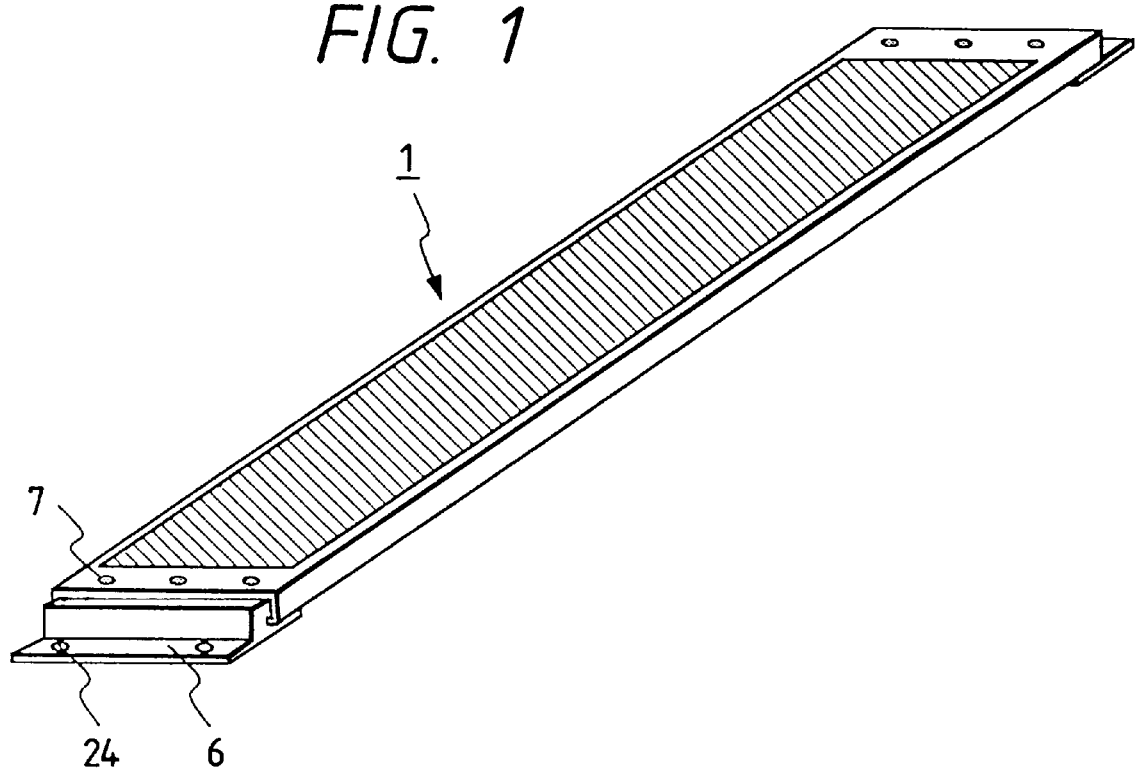
FIG. 1 is a perspective view showing an example of a solar cell module according to an embodiment of the invention.
Figure 2:
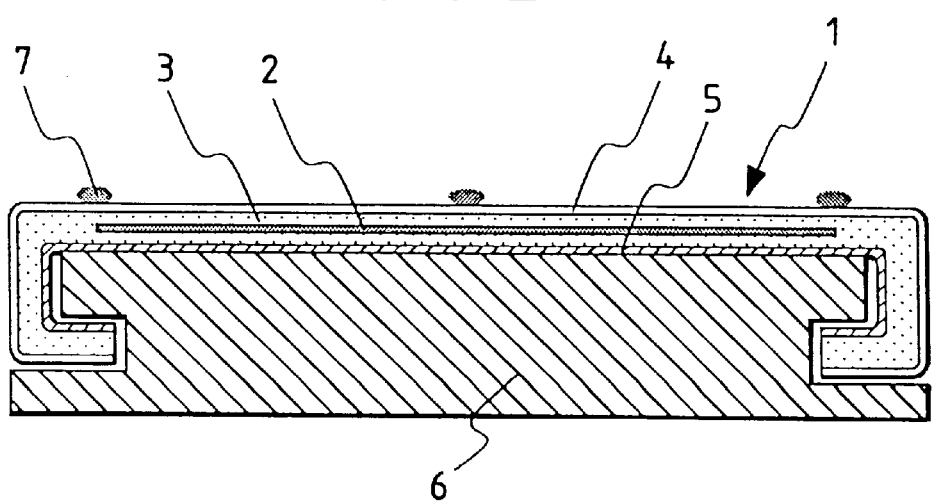
FIG. 2 is a cross-sectional view of the solar cell module shown in FIG. 1.
Figure 12:
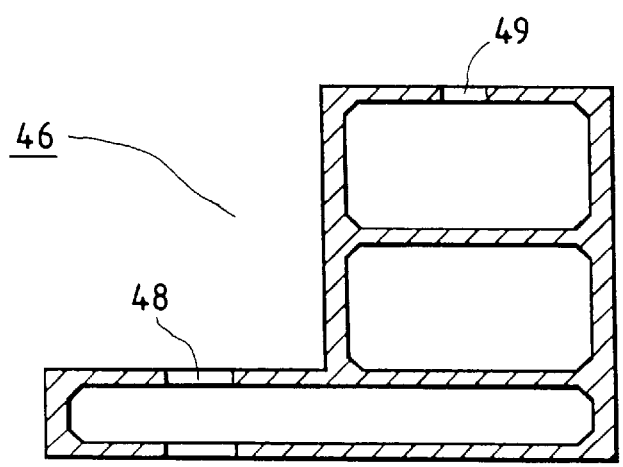
FIG. 12 is a cross-sectional view showing a frame member used in the solar cell module according to example 1 of the invention.
Figure 13:
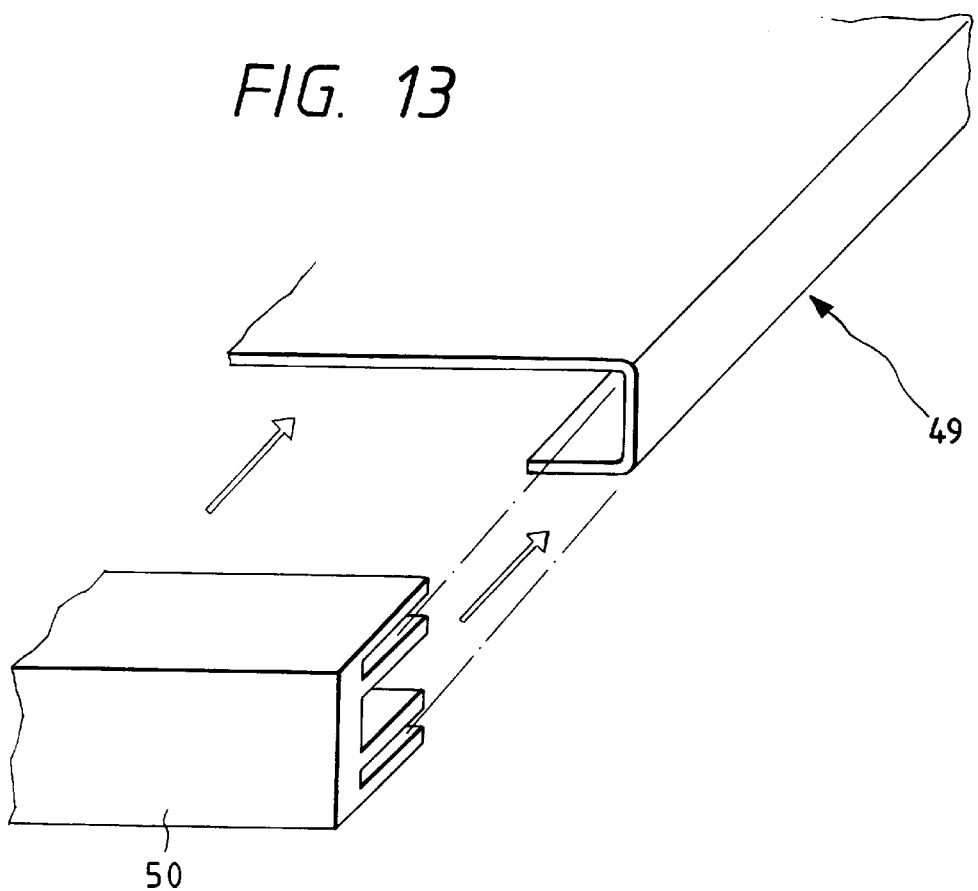
FIG. 13 is a perspective view showing a solar cell module according to example 2 of the invention.
Figure 14:
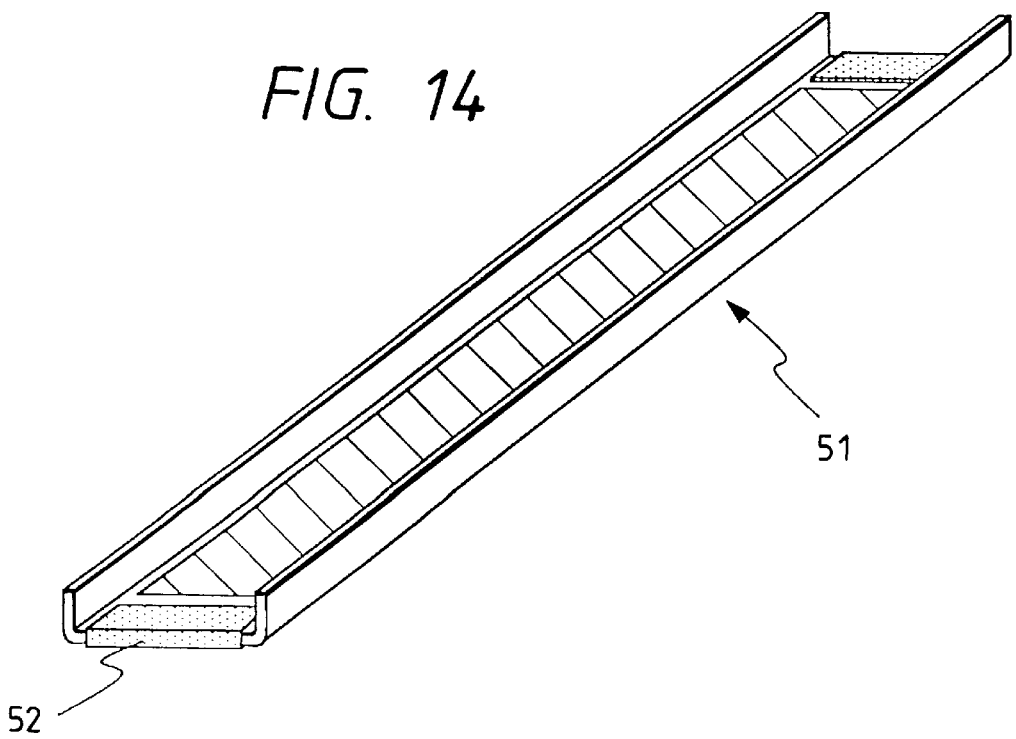
FIG. 14 is another perspective view showing the solar cell module according to example 2 of the invention.
Figure 15:
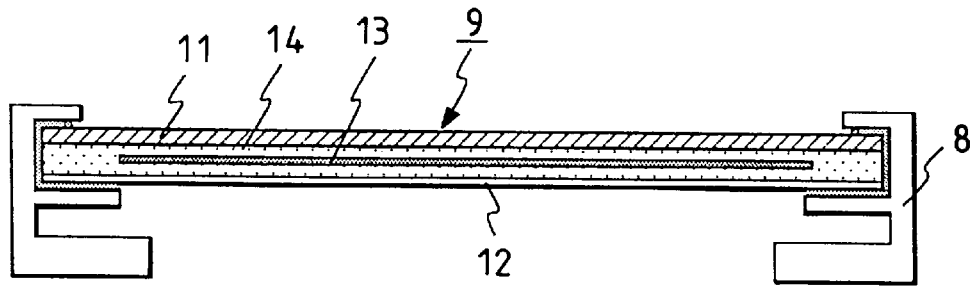
FIG. 15 is a cross-sectional view showing an example of a conventional solar cell module.
Figure 16:
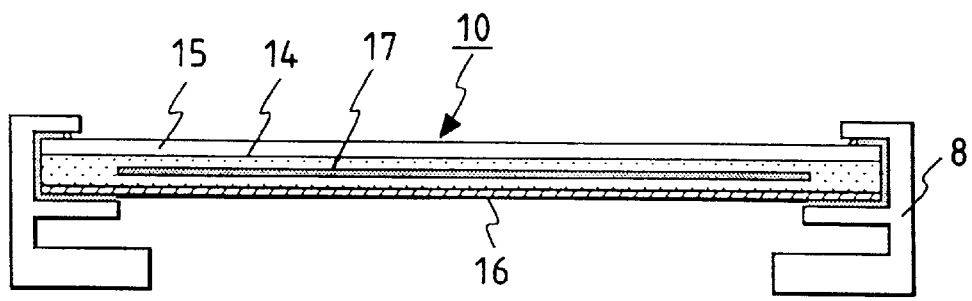
FIG. 16 is a cross-sectional view showing another example of the conventional solar cell module.

Next, a reinforcement member 6 is fitted to the shorter sides of the module. The reinforcement member 6 is made of aluminum which has an L-shaped section as shown in FIG. 12, an E-shaped section as shown in FIG. 13, or a U-shaped section as shown in FIG. 14. The frame member 6 may be secured to the solar cell module 1 with a screw in drilled hole 7, otherwise, with a rivet, by weld, or an adhesive. Compared to the conventional module in which a frame member is fitted to four sides, the number of the members is reduced, and the attachment of the members is easier. The frame member 6 has a shape corresponding to the cross section of the module as shown in FIG. 2. This prevents invasion of wind and rain to the back surface of the module.

The solar cell module of the present invention fabricated in such a manner can have a sufficient structural strength as a unit, and can be fabricated inexpensively.

This is because the solar cell module is made using the roller mold machine, and the structural strength of the module is increased by providing the frame member, considering the difficulty of bending the short sides.

Structure of Module

Referring to FIG. 2, the structure of the solar cell module 1 of the present invention will be described.

The solar cell module 1 of the present invention has a solar cell element 2 sealed by a translucent resin 3, a translucent resin film 4 on the surface of a light receiving side, and a metal plate 5, which is subjected to the foregoing bending, on the back surface opposite the light receiving side. These components are laminated together by adhesives. An insulating film may be provided between the metal plate 5 and the solar cell element 2. In order to increase scratch resistance, a glass non-woven cloth may be disposed between the film and the element 2.

Solar Cell Element

The solar cell element used in the solar cell module according to the present invention is not limited to specific types. However, a solar cell element having flexibility is preferable. Particularly, an amorphous silicon solar cell formed on a stainless substrate is preferable.

By using a solar cell element having flexibility, even if a force is applied to the solar cell module when it is bent by the roller mold machine etc., the solar cell element is not destroyed.

Translucent Resin Film

The translucent resin film used on the light receiving surface of the solar cell module according to the present invention preferably is weather resistant, and, for example, a fluororesin film is suitable.

Furthermore, when the film is stretched by the bending, the fluororesin film is preferably extendable by more than 250% in order that breakages and cracks in the film are not caused. When it is less than 250%, there is a possibility that cracks of the film are caused at the bending of the solar cell.

Translucent Resin

The translucent resin used for sealing the solar cell module according to the present invention may be, for example, ethylene-vinyl acetate copolymer (EVA), EEA, polyvinyl butyral, silicone resin, and the like.

Metal Reinforcement Plate

The metal reinforcement plate used in the solar cell module according to the present invention is preferably excellent in weather resistance and bendability, and has shown a long term reliability as a common metal roofing material. For example, it may be a galvanized sheet, a steel plate having a weather resistant coating such as fluororesin or vinyl chloride on galvanized steel, a stainless steel plate, and the like.

Insulating Film

The insulating film used in the solar cell module according to the present invention may be PET (polyethylene terephthalate), a nylon film, and the like.

EXAMPLES

Example 1

Figure 5:
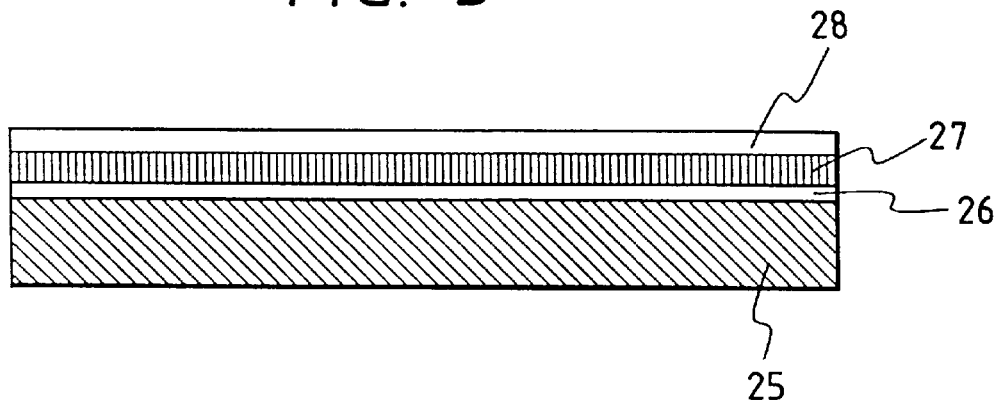
FIG. 5 is a sectional view showing a solar cell element used in the solar cell module according to example 1 of the invention.

(1) First, a solar cell having the structure shown in FIG. 5 was fabricated in the following manner. On a stainless steel substrate roll 25 having a thickness of 0.1 mm, an aluminum thin film 26 having a thickness of 500 nm, an amorphous silicon semiconductor layer 27 having a nip junction, and an ITO thin film 28 having a thickness of 80 nm were sequentially laminated.

Figure 6:
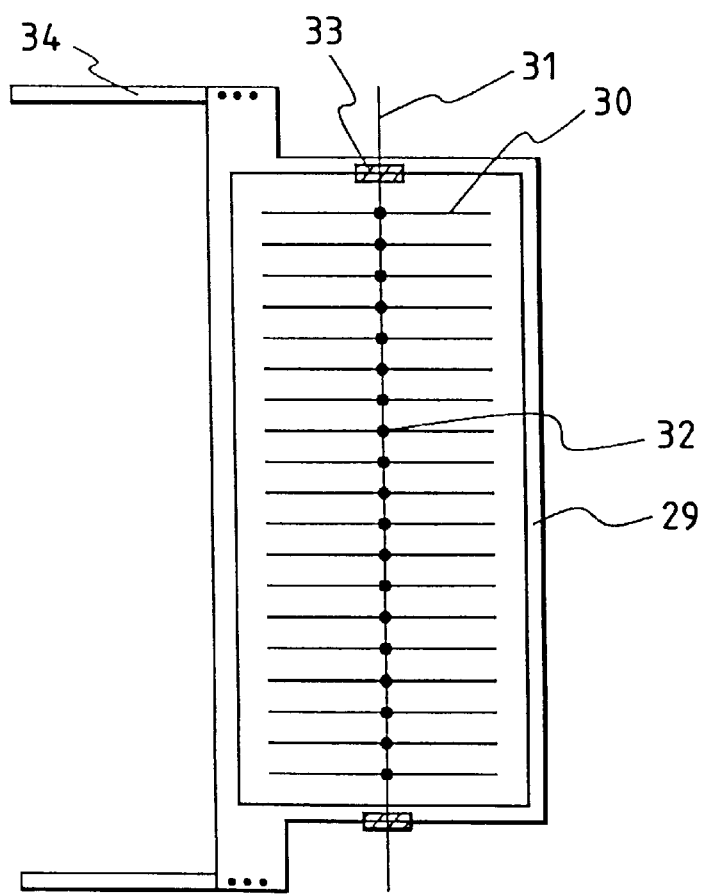
FIG. 6 is a plan view showing the solar cell element used in the solar cell module according to example 1 of the invention.

(2) Next, the stainless steel substrate roll 25 was press-cut punched to a size of 30 cm×9 cm so that a press having the shape shown in FIG. 6 was formed. In order to prevent short circuits at the cut edges, a portion denoted by a reference numeral 29 is formed by partially removing the ITO thin film located at the outer periphery of the substrate 25. Electrodes 30 were formed by a silver paste (Dupont 5007), and a bus bar 31 made of a tin-plated copper wire was adhered by a silver ink adhesive 32 (Emerson & Cuming C-220) to form an upper electrode.

Furthermore, copper foils 34 were welded to the back surface of the stainless steel substrate to form a lower electrode. Reference numeral 33 is a polyimide tape to prevent short circuits. FIG. 7 is a cross-sectional of view of FIG. 6.

(3) The solar cells were then connected in series by soldering the tin-plated copper wire 31 with the copper foils 34 of the adjacent cell as shown in FIG. 8, and thirty cells were connected in series.

Figure 9:
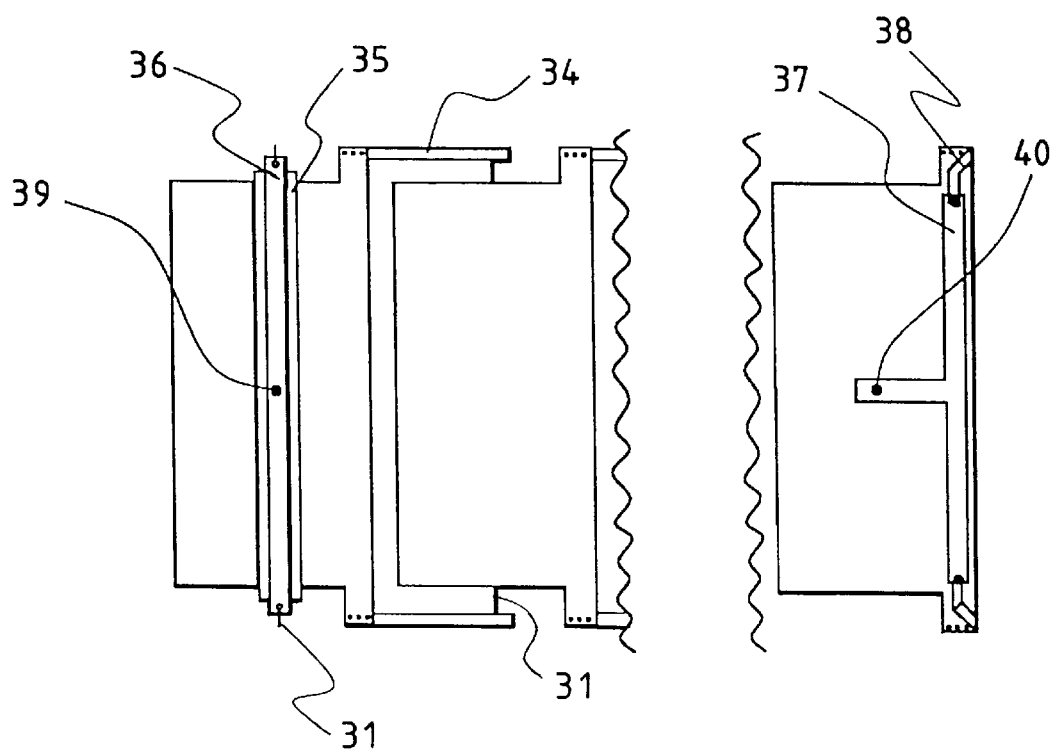
FIG. 9 is a plan view showing a back wiring surface in the solar cell module according to example 1 of the invention.

(4) Terminals to supply power to the outside were provided on the back surface of the end cells as shown in FIG. 9. The upper bus wire electrode 31 was connected to a copper tab 36, and the copper tab 36 was adhered to the substrate via insulating tape. The lower electrode welds the copper tab 38 directly to the substrate, and the copper tab 37 was connected by soldering. The power is outputted through the terminals 39 and 40.

Figure 11:
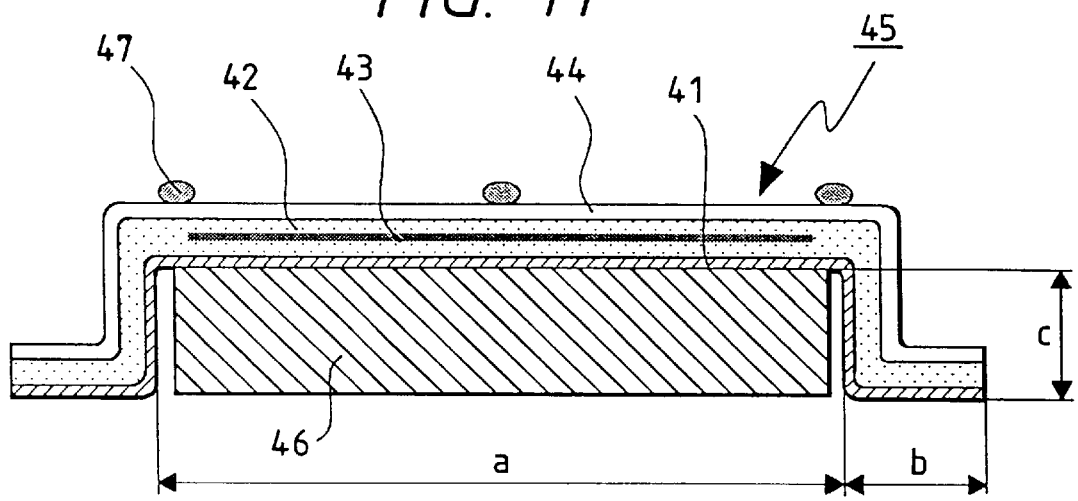
FIG. 11 is a cross-sectional view showing the solar cell module according to example 1 of the invention.

(5) Referring now to FIG. 11, on the surface of a galvanized sheet 0.4 nm thick, EVA 42, the series connected solar cell element 43 prepared in the foregoing paragraph (4), EVA 42, and a fluororesin film 44 were sequentially laminated, and the EVA was fused at a temperature of 150° C. using a vacuum laminater so that they were adhered and laminated to each other to form the solar cell module. In the solar cell module, as the EVA, a sheet of EVA 900 $\mu$m thick was used, and a non-stretched ethylene-tetraethylene copolymer fluororesin film (AFLEX manufactured by Asahi Glass Co., Ltd.) of 50 $\mu$m thickness was used as the fluororesin film. The portions of the EVA and the fluororesin film which protruded from the metal reinforcement plate 41 were cut. The size of the solar cell module was 470 mm×3000 mm.

(6) The planar solar cell module prepared in the paragraph (5) was bent by the roller mold machine to form the cell module in a hat-shaped cross section as shown in FIG. 11. As for the dimensions of the portions a, b, and c shown in FIG. 11, the portion a was 350 mm, the portion b was 30 mm, and the portion c was 30 mm.

(7) A frame member was fixed to the shorter sides of the solar cell module subjected to the bending of paragraph (6). The frame member (see FIG. 12) is manufactured from drawn aluminum material. A hole 49 for fixing the frame member to the module by a screw is formed in its upper portion.

Figure 10:
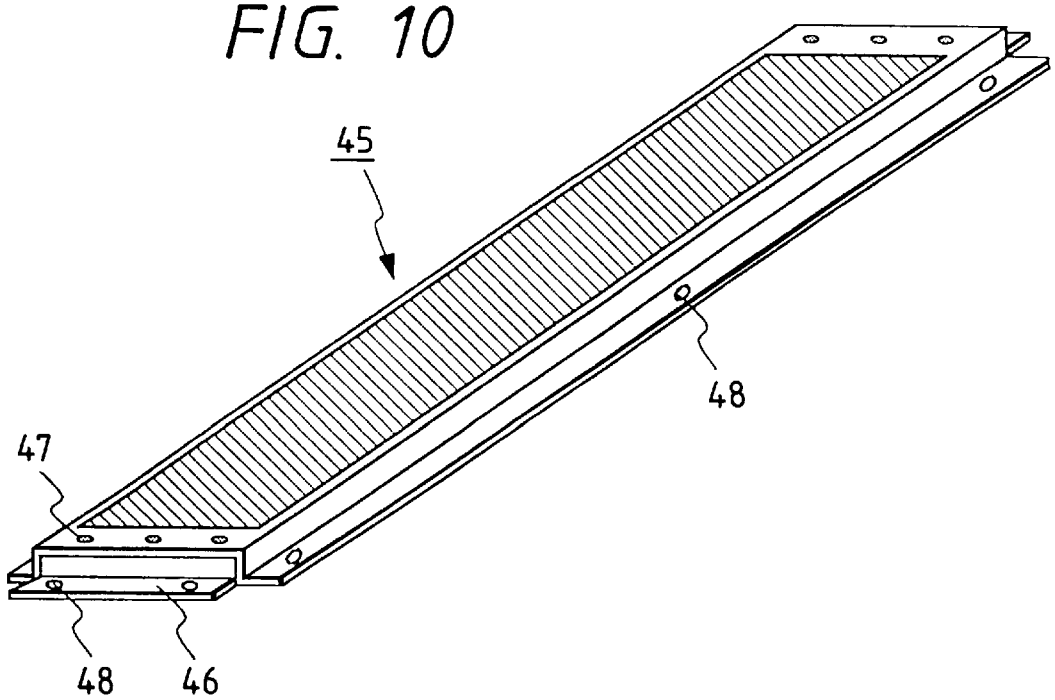
FIG. 10 is a perspective view showing the solar cell module according to example 1 of the invention.

The solar cell module of this example shown in FIG. 10 is fabricated in the above-described manner.

This solar cell module is fitted to a mounting stage by bolts and nuts and the like, utilizing fitting holes 48 formed in the frame member and the metal reinforcement plate itself.

Example 2

The solar cell module of this example is bent into a U-shaped cross section as shown in FIG. 13. Then, the solar cell module was fitted to a frame member made of aluminum using a silicon sealant as an adhesive.

The solar cell module 49 of this example was fabricated in a similar manner to that of example 1. As shown in FIG. 13, the longer sides thereof were bent by the roller mold machine so that they have a U-shaped cross section.

The silicon sealant was applied to a frame member 50, and the frame member 50 was fitted to the solar cell module 49 as shown by the arrows of FIG. 13.

In this example, the shorter sides of the solar cell module 49 were inserted into the frame member 50, so that separations at interfaces between the metal reinforcement plate and the EVA resin never occurred. The reliability of the solar cell module 49 was greatly increased.

Furthermore, since screws are not used in this solar cell module, its exterior appearance is excellent.

Example 3

The solar cell module of this example was designed so that it has a shape suitable for a tile roofing.

A perspective view of the solar cell module is shown in FIG. 14. As is understood from FIG. 14, in the solar cell module of this example, the longer sides thereof were bent upward, and in the shorter sides thereof, the frame member was provided, which was formed by bending a steel material.

The solar cell module 51 of this example was fabricated in a similar manner to that of example 1. As shown in FIG. 14, the longer sides of the solar cell module 51 were bent upwardly by the roller mold machine.

The frame member 52 was formed by bending a steel plate which is 0.4 mm thick, coated with stainless steel, so that it has a U-shaped cross section. The frame member 52 was fitted to a planar portion at the center of the module using a silicon sealant as an adhesive.

The solar cell module of this example having the foregoing shape was installed on a roof. A sufficient structural strength was provided by the foregoing constitution.

What is claimed is:

1. A solar cell module comprising:
   a solar cell element;
   a rectangular metal plate, having two opposing longer sides and two opposing shorter sides;

a filler resin; and a filler resin film, wherein the extensibility of said filler resin film is 250% or more;

wherein said solar cell element is sealed by said filler resin and is sandwiched between said rectangular metal plate and said filler resin film which covers a light incident surface of said solar cell element;

wherein said two opposing longer sides of said rectangular metal plate are bent to form bent portions;

wherein a reinforcement member is provided on at least one of said two opposing shorter sides of said rectangular metal plate;

wherein all of said bent portions of said rectangular metal plate are covered with said filler resin film on a side of said rectangular metal plate on which said solar cell element is mounted; and wherein said reinforcement member sandwiches said rectangular metal plate and said filler resin film which covers said rectangular metal plate at least at a planar portion thereof.

2. A solar cell module according to claim 1 wherein said two opposite sides are bent in a direction opposed to the light receiving surface of said solar cell element.

3. A solar cell module according to claim 1 wherein said two opposite sides are bent in a direction toward the light receiving surface of said solar cell element.

4. A solar cell module according to claim 1 wherein one of said two opposite sides is bent in a direction opposed to a light receiving surface and the other of said two opposite sides is bent toward the light receiving surface.

5. A solar cell module according to claim 1 wherein said reinforcement member comprises a portion for fitting said metal plate.

6. A solar cell module according to claim 5 wherein a sealant is provided in said fitting portion.

7. A solar cell module according to claim 5 wherein said reinforcement member is made of a U-shaped steel plate.

8. A solar cell module according to claim 1 wherein said metal plate and said reinforcement member are connected by a screw.

9. A solar cell module according to claim 1 wherein said metal plate and said reinforcement member are connected by a rivet.

10. A solar cell module according to claim 1 wherein said metal plate and said reinforcement member are connected by welding.

11. A solar cell module according to claim 1 wherein said metal plate and said reinforcement member are connected by adhering.

12. A solar cell module according to claim 1 wherein said reinforcement member is made of drawn aluminum material.

13. A solar cell module according to claim 1 wherein said solar cell module is formed by sequentially laminating an insulating film, said solar cell element, a filter material, and a surface protection film on said metal plate.

14. A solar cell module according to claim 13 wherein said insulating film is either polyethylene terephthalate film or a nylon film.

15. A solar cell module according to claim 13 wherein a filler material is provided between said insulating film and said metal plate.

16. A solar cell module according to claim 15 wherein said filler material is selected from ethylene-vinyl acetate copolymer, ethylene-ethyl acrylate copolymer, polyvinyl butyral, and silicone resin.

17. A solar cell module according to claim 13 wherein a filler material is provided between said insulating film and said solar cell element.

18. A solar cell module according to claim 17 wherein said filler material is selected from ethylene-vinyl acetate copolymer, ethylene-ethyl acrylate copolymer, polyvinyl butyral, and silicone resin.

19. A solar cell module according to claim 13 wherein said filler material is selected from ethylene-vinyl acetate copolymer, ethylene-ethyl acrylate copolymer, polyvinyl butyral, and silicone resin.

20. A solar cell module according to claim 1 wherein said metal plate is a galvanized steel plate or a stainless steel plate.

21. A solar cell module according to claim 1 wherein said solar cell element is flexible.

22. A solar cell module according to claim 1 wherein said solar cell element is made of a non-single crystal semiconductor.

23. A solar cell module according to claim 22 wherein said solar cell element is made of an amorphous semiconductor formed on a stainless steel substrate.

24. A solar cell module according to claim 1, wherein said reinforcement member is formed by bending a metal plate.

25. A method of manufacturing a solar cell module, comprising the steps of:

vacuum-laminating successively a rectangular metal plate having two opposing longer sides and two opposing shorter sides, a solar cell element sealed in a filler resin, and a filler resin film, wherein the extensibility of said filler resin film is 250% or more and said filler resin film covers a light incident surface of said solar cell element;

bending two opposite sides of said solar cell module which correspond to said two opposing longer sides of said rectangular metal plate by a pair of rotating rollers to form bent portions; and fitting a reinforcement member to at least one of the two remaining sides which correspond to said two opposing shorter sides of said rectangular metal plate;

wherein all of said bent portions are covered with said filler resin film on a side of said rectangular metal plate on which said solar cell element is mounted; and wherein said reinforcement member sandwiches said rectangular metal plate and said filler resin film which covers said rectangular metal plate at least at a planar portion thereof.

26. A method of manufacturing a solar cell module according to claim 25, wherein said reinforcement member is formed by bending a metal plate.

* * * * *

UNITED STATES PATENT AND TRADEMARK OFFICE
CERTIFICATE OF CORRECTION

PATENT NO. : 6,025,555

DATED : February 15, 2000

INVENTOR(S) : MASAHIRO MORI ET AL.

It is certified that error appears in the above-identified patent and that said Letters Patent is hereby corrected as shown below:

ON THE TITLE PAGE:

[73] Assignee:
        "Canon Kabushiki Kaishia" should read
        --Canon Kabushiki Kaisha--.

COLUMN 2:

Line 33, "wherein" should read --comprising--.

COLUMN 3:

Line 23, "that" should read --in which--.

COLUMN 4:

Line 66, "EEA," should read --ethylene-ethylacrylate
        copolymer (EEA),--.

UNITED STATES PATENT AND TRADEMARK OFFICE
CERTIFICATE OF CORRECTION

PATENT NO. : 6,025,555
DATED : February 15, 2000
INVENTOR(S) : MASAHIRO MORI ET AL.

Page 2 of 2

It is certified that error appears in the above-identified patent and that said Letters Patent is hereby corrected as shown below:

COLUMN 5:

Line 38, "of" (1st occurrence) should be deleted.

COLUMN 7:

Line 52, "drawn" should read --a drawn--;
  Line 56, "filter" should read --filler--; and
  Line 59, "either" should read --a--.

Signed and Sealed this

Seventeenth Day of April, 2001

Attest:

NICHOLAS P. GODICI

Attesting Officer          Acting Director of the United States Patent and Trademark Office